United States Patent
Bovier et al.

(10) Patent No.: US 8,154,292 B2
(45) Date of Patent: Apr. 10, 2012

(54) APPARATUS FOR CARRYING OUT DNP-NMR MEASUREMENTS WITH A COMPENSATION CONFIGURATION AND METHOD FOR DESIGNING THE COMPENSATION CONFIGURATION

(75) Inventors: Pierre-Alain Bovier, Zurich (CH); Robert Schauwecker, Zurich (CH); Daniel Eckert, Bachenbuelach (CH)

(73) Assignee: Bruker BioSpin AG, Faellanden (DE)

( * ) Notice: Subject to any disclaimer, the term of this patent is extended or adjusted under 35 U.S.C. 154(b) by 388 days.

(21) Appl. No.: 12/458,488

(22) Filed: Jul. 14, 2009

(65) Prior Publication Data

US 2010/0171495 A1 Jul. 8, 2010

(30) Foreign Application Priority Data

Jul. 18, 2008 (DE) .......................... 10 2008 033 886

(51) Int. Cl.
*G01V 3/00* (2006.01)
(52) U.S. Cl. ....................................................... 324/318
(58) Field of Classification Search ........... 324/300–322
See application file for complete search history.

(56) References Cited

U.S. PATENT DOCUMENTS

| | | | |
|---|---|---|---|
| 6,515,260 B1 | 2/2003 | Anderson | |
| 6,937,020 B2* | 8/2005 | Munson et al. | 324/321 |
| 7,639,007 B2* | 12/2009 | Hutton et al. | 324/307 |
| 7,646,200 B2* | 1/2010 | Slade et al. | 324/321 |
| 7,701,218 B2* | 4/2010 | Noonan et al. | 324/319 |
| 2006/0261812 A1 | 11/2006 | Ariyoshi | |
| 2007/0038076 A1* | 2/2007 | Osada et al. | 600/420 |

FOREIGN PATENT DOCUMENTS

| | | |
|---|---|---|
| EP | 0 431 848 | 6/1991 |
| EP | 0 710 852 | 5/1996 |
| EP | 1 460 445 | 9/2004 |
| WO | WO 02/37132 | 5/2002 |
| WO | WO 2007/007022 | 1/2004 |
| WO | WO 2005/114244 | 12/2005 |

OTHER PUBLICATIONS

Jan H. Ardenkjaer-Larsen et al. "Increase in signal-to-noise ration of >10,000 times in liquid-state NMR", PNAS, Sep. 2, 2003, vol. 100, No. 18.

* cited by examiner

*Primary Examiner* — Dixomara Vargas
(74) *Attorney, Agent, or Firm* — Paul Vincent

(57) ABSTRACT

An apparatus for DNP-NMR measurement on a sample, with a magnet configuration for producing a magnetic field in a first working volume and in, a second working volume with a magnetic field gradient in the direction of an axis (z) which extends through the second working volume, with a device for measuring MR signals, with a DNP excitation device, and with a positioning mechanism for transferring the sample, is characterized in that, near the second working volume, a compensation configuration made of magnetic material is mounted that, in the operating condition of the magnet configuration, produces a magnetic field gradient in the direction of the axis (z) in the second working volume that is between −90% and −110% of the magnetic field gradient of the same order of the stray field of the magnet configuration.

22 Claims, 7 Drawing Sheets

APPARATUS FOR CARRYING OUT DNP-NMR MEASUREMENTS WITH A COMPENSATION CONFIGURATION AND METHOD FOR DESIGNING THE COMPENSATION CONFIGURATION

This application claims Paris Convention priority of DE 10 2008 033 886.9 filed Jul. 18, 2008 the complete disclosure of which is hereby incorporated by reference.

BACKGROUND OF THE INVENTION

The invention relates to an apparatus for carrying out DNP-NMR measurements on a sample, with a magnet configuration for producing a magnetic field in a first working volume, wherein the magnet configuration produces a stray field in a second working volume in the direction of an axis with at least one magnetic field gradient of first or higher order in the direction of the axis, wherein the axis extends through the second working volume, with a device for measurement of magnetic resonance (MR) signals of the sample from the first working volume, with a DNP excitation device for DNP excitation of the sample in the second working volume, and with a positioning mechanism for transferring the sample between the second working volume and the first working volume.

Such a configuration is known from WO 2005/114244 A1.

Nuclear magnetic resonance (NMR) spectroscopy is a commercially widespread method for characterizing the chemical composition of substances. However, this method has the disadvantage that it is not very sensitive because the polarization of the atomic nuclei is only weak even in large magnetic fields. To improve the signal-to-noise ratio, either the noise can be reduced or the signal increased. Over the past few years, great efforts have been made to suppress the noise. Cooled probeheads have been developed for this purpose.

To increase the signal, stronger magnets can, for example, be built. Alternatively, the so-called DNP (dynamic nuclear polarization) method can be deployed. In this case, the electrons of the sample that are strongly polarized in the background field of the magnet are excited into electron paramagnetic resonance (EPR) by radiation in the microwave range. Because of interaction of the electron spins with the atomic nuclei, their spins are also strongly polarized. While the polarization of the atomic nuclei in equilibrium at room temperature in a background field of 10 Tesla is typically a few 10 ppm, it can be as much as several percent with DNP, the sample having to be frozen and reheated for this purpose. It is crucial to conduct the NMR experiment before this polarization is lost.

Basically, there are two ways of deploying DNP: Either the EPR pre-polarization is performed in the NMR working volume or the sample is pre-polarized in a second working volume and then transported into a first working volume for conducting the NMR experiment. The former method has the disadvantage that, because of the typically very large field strength in the NMR working volume, a very high-frequency radiation is required for the EPR excitation, which is technically very difficult. In the latter case, to which this invention relates, there must be a mechanism that transports the sample from the second working volume into the first working volume. This transporting mechanism must operate as rapidly as possible so that the sample is still sufficiently polarized for the NMR experiment. It is therefore advantageous if the two working volumes are as close together as possible. In the stray field of an NMR magnet configuration, there is usually an area where the field strength is suitable for DNP excitation.

For the sample to be adequately pre-polarized, the magnetic field in the second volume must be sufficiently homogeneous. The stray field of an NMR magnet does not meet this requirement and must therefore be corrected. One solution to this problem is disclosed in WO 2005/114244 A1. There it is proposed that a superconducting magnet be located around the first working volume and a further superconducting magnet be located around the second working volume. The further magnet has the task of homogenizing the field in the second working volume but must not impair the homogeneity in the first working volume.

One essential disadvantage of the configuration according to WO 2005/114244 A1 is that a conventional NMR magnet system cannot be upgraded in this manner, meaning that the entire DNP-NMR magnet system has to be developed anew. If it is a superconducting magnet configuration, the cryostat normally also has to be changed.

Moreover, the mutual influence of the two magnets is also problematic. In particular, the magnetic force between the magnets can become so large that the further magnet around the second working volume has to be shielded. This is possible both actively by the use of superconducting coils and passively with the aid of ferromagnetic material, as described in WO 2005/114244 A1. On the other hand, the field homogeneity in each working volume must not be influenced too strongly by the other magnet. All these conditions can lead to complicated coil configurations.

The object of this invention is, by contrast, to propose an apparatus with a second working volume for DNP-NMR excitation, in which the homogenization of the magnetic field in the second working volume is achieved by simple technical means, so that the apparatus can also be obtained by upgrading a conventional NMR magnet configuration.

SUMMARY OF THE INVENTION

This object is inventively solved by providing a compensation configuration made of magnetic material near the second working volume. In the operating condition of the magnet configuration, this compensation configuration produces, in the direction of the axis in the second working volume, at least one magnetic field gradient of first or higher order that is between −90% and −110% of the magnetic field gradient of the same order of the stray field of the magnet configuration in the direction of the axis in the second working volume.

In the superposition of the stray field of the magnet configuration with the field of the compensation configuration in the second working volume, this gradient or these gradients are therefore smaller by a factor of at least 10 than the gradient or gradients of the stray field of the magnet configuration alone. Together with the magnet configuration in the region of the second working volume, the compensation configuration therefore produces a magnetic field plateau (homogeneous field), which is necessary for pre-polarization of the sample by means of DNP. The role of the compensation configuration is essentially to improve the homogeneity in the second working volume. The contribution to the strength of the magnetic field in the second working volume is essentially provided by means of the magnet configuration, which permits compact dimensioning of the compensation configuration.

Unlike the two shielding methods known from WO 2005/114244 A1, which refer to the methods for stray field shielding of two magnet coils positioned close together, the magnetic material in this invention only compensates for one or more field gradients in the second working volume, which are produced by the magnet configuration disposed around the first working volume at the position of the second working volume. In this way, the further coil system necessary according to WO 2005/114244 A1 can be dispensed with in principle. This is advantageous, in particular, for simple upgrading of existing NMR systems.

The compensation configuration preferably comprises magnetically soft sections that are magnetized by the field of the magnet configuration in the operating condition of the magnet configuration. Magnetically soft material has the favorable property that it is already strongly magnetized in low magnetic fields, allowing the compensation configuration to be compactly dimensioned. For example, magnetic steel could be used as the magnetically soft material, as long as the background field is strong enough. This is both an especially low-cost solution and magnetic steel usually exhibits high saturation magnetization. For applications in a low field, materials with higher permeability are advantageous, for example, the iron-nickel alloy FeNi48 (Nifemax®) to ensure that the material is sufficiently magnetized and therefore exhibits maximum field efficiency.

The saturation magnetization of the magnetically soft sections is preferably at least $10^6$ A/m, which permits compact dimensioning of the compensation configuration.

It is especially advantageous if the distance between the center of gravity of the first working volume and the center of gravity of the second working volume is greater than the distance between the center of gravity of the first working volume and the center of gravity of the totality of the magnetically soft sections. To produce a magnetic field plateau in the second working volume the magnetically soft shielding material of the compensation configuration is therefore preferably mostly located in a region between the first and the second working volume, where the stray field of the magnet configuration is stronger than at a greater distance from the first working volume. In principle, permanent magnets can also be used to strengthen the magnetic field gradient of the compensation configuration, wherein depending on the direction of their magnetization, a position between the first and the second working volume or another position can be advantageous.

If the magnet configuration is a Helmholtz configuration, for example, the second working volume can be located in the plane between the coil pairs, so that the axis in the second working volume is aligned perpendicularly with respect to the connecting line between the center of gravity of the first and the center of gravity of the second working volume. By contrast, in a solenoid-shaped magnet configuration, for example, both working volumes must be on the solenoid axis, so that sample transportation between the two working volumes is possible. In a solenoid-shaped magnet configuration, the center of gravity of the first working volume and the center of gravity of the second working volume are on the axis through the second working volume. This configuration is especially advantageous because the most commonly used NMR magnet configurations are equipped with solenoid-shaped magnet coils.

In such an apparatus, it is especially advantageous if the compensation configuration is rotationally symmetrical with respect to the axis because the symmetry of the magnet configuration and that of the compensation configuration then match, which simplifies design of the compensation configuration.

In a special further embodiment of such an apparatus, the magnetically soft sections have a common inner or outer diameter, with the wall thickness of these sections becoming smaller or remaining constant with increasing distance from the first working volume in the direction of the axis. The stray field of the magnet configuration usually increases towards the first working volume so that it is advantageous for formation of a field plateau in the second working volume if the thickness of the magnetic material of the compensation configuration increases in this direction. Due to the common inner or outer diameter, the compensation configuration can be easily held in place.

In an especially preferred embodiment of the inventive apparatus, the magnet configuration is at least partially superconducting and is located at least partially in a cryostat having a bore in which the first working volume and the second working volume are disposed. Superconducting magnet configurations have the major advantage that they can produce very strong magnetic fields.

In a special variant of this embodiment, the compensation configuration is disposed at least partially in the bore of the cryostat. If the compensation configuration is disposed entirely in the room temperature access to the first working volume, it can be mounted, unmounted, and modified without having to warm up and open the cryostat.

Alternatively, the compensation configuration can be disposed outside the bore of the cryostat, in particular, in a region of the cryostat with a temperature below room temperature, preferably in a region of the cryostat with the operating temperature of the superconducting parts of the magnet configuration. This is interesting, in particular, if there is insufficient space in the room temperature access for the compensation configuration. A further advantage is the temperature stability of the compensation configuration because then its magnetization and its spatial position relative to the magnet configuration also remain stable over time, resulting in a field in the second working volume that is very stable over time.

The axis of the bore of the cryostat preferably coincides with the axis in the second working volume because then simpler, in particular, axially symmetrical, compensation configurations are possible.

The distance between the center of gravity of the first working volume and the center of gravity of the second working volume is preferably less than 1 meter. This ensures the time for transferring the sample from the second working volume into the first working volume is short so that the loss of pre-polarization of the sample also remains small.

In the operating condition of the magnet configuration, the absolute value of the magnetic field strength along the path between the center of gravity of the first working volume and the center of gravity of the second working volume is preferably at least half the absolute value of the magnetic field strength in the second working volume at all points. The sample passing through a smaller magnetic field during transfer could result in unwanted loss of polarization.

If the magnet configuration comprises a coil configuration that at least partially compensates for the dipole moment of the magnetic configuration, the distance between the first and the second working volume can be reduced, which permits shorter transfer times and therefore a lower loss of pre-polarization of the sample.

In a special embodiment, a further coil configuration is provided that can be supplied with electric current and produces, in the second working volume, a homogeneous magnetic field contribution and/or a magnetic field gradient of first or higher order in the direction of the axis. This further coil configuration thus performs the task of a shim coil to correct a residual gradient, which may be caused by any imperfections in the compensation configuration. In this way, the field homogeneity in the second working volume can be further improved.

A specially simple variant of this embodiment results if the further coil configuration is normally conducting, in particular, if the further coil configuration is located partially in the bore of the cryostat of the superconducting magnet configuration, wherein the magnet configuration is preferably also superconducting.

As an alternative, however, it is possible to provide an apparatus in which both the magnet configuration and the further coil configuration are superconducting, the magnet configuration preferably also being superconducting. The further coil configuration is then advantageously disposed in the cryostat of the superconducting magnet configuration.

In an especially preferred embodiment, a device is provided for moving the compensation configuration or sections of the compensation configuration and for moving the second working volume along the axis. For this purpose, the compensation configuration is moved in such a way that, in the superposition of the field contribution of the compensation configuration with the field contribution of the magnet configuration, the absolute value of at least one of the magnetic field gradients of first or higher order in the direction of the axis in the second working volume is minimal, in particular, is less than 10% of the absolute value of the magnetic field gradient of the same order of the stray field of the magnet configuration.

The invention also relates to a method for designing a compensation configuration of magnetic material in an apparatus such as is described above characterized in that, in the second working volume in the direction of the axis, at least one measurement is performed of a magnetic field profile that results from the superposition of the field contribution of the compensation configuration with the field contribution of the magnet configuration and in that, based on the measurement, the compensation configuration is changed at least once to ensure that, in the superposition of the field contribution of the compensation configuration with the field contribution of the magnet configuration, the absolute value of at least one magnetic field gradient of first or higher order becomes smaller in the direction of the axis in the second working volume.

The simplest variants of the step of changing the compensation configuration involve the mounting or removal of magnetic material, in particular, the mounting of magnetic foils.

A further advantageous improvement of the field homogeneity in the second working volume is obtained by a method for positioning the compensation configuration and the second working volume characterized in that, in the second working volume in the direction of the axis, at least one measurement is performed of the magnetic field profile that results from the superposition of the field contribution of the compensation configuration with the field contribution of the magnet configuration, and in that, based on the measurement, the compensation configuration or sections of the compensation configuration are moved along the axis together with the second working volume so that, in the superposition of the field contribution of the compensation configuration with the field contribution of the magnet configuration, the absolute value of at least one magnetic field gradient of first or higher order in the direction of the axis is reduced in the second working volume.

Designing and/or optimization of the inventive compensation configuration is therefore performed, according to the method variants described, by changing the magnetic material of the compensation configuration and/or by moving the compensation configuration along the axis that is defined by the field vector of the stray field of the magnet configuration at the location of the second working volume. The magnitude of the change and/or the movement of the magnetic material depends on the order and the strength of the field gradient or gradients to be minimized along the axis in the second working volume, the field gradient or gradients being determined by measurement of the field profile of the superposition of the field contribution of the compensation configuration with the field contribution of the magnet configuration. It can be advantageous to repeat at least one of these steps of the method so that a further change and/or movement of the compensation configuration can be effected. Normally, however, the change and/or movement of the compensation configuration provides fine correction of the magnetic field gradient by which a magnetic field that is sufficiently homogeneous for DNP excitation can be simply produced within the second working volume without, for example, imprecision of the magnet configuration or the compensation configuration due to production flaws having to be corrected by more complex subsequent measures. In particular, a magnetic field gradient can be achieved in the second working volume that is smaller than 10% of the absolute value of the magnetic field gradient of the same order of the stray field of the magnet configuration.

Further advantages of the invention result from the description and the drawing. The characteristics stated above and below can, furthermore, be used individually or in any combinations. The embodiments shown and described are not intended to be an exhaustive list but are examples used to explain the invention.

BRIEF DESCRIPTION OF THE DRAWING

The figures show

DESCRIPTION OF THE PREFERRED EMBODIMENT

Figure 1:
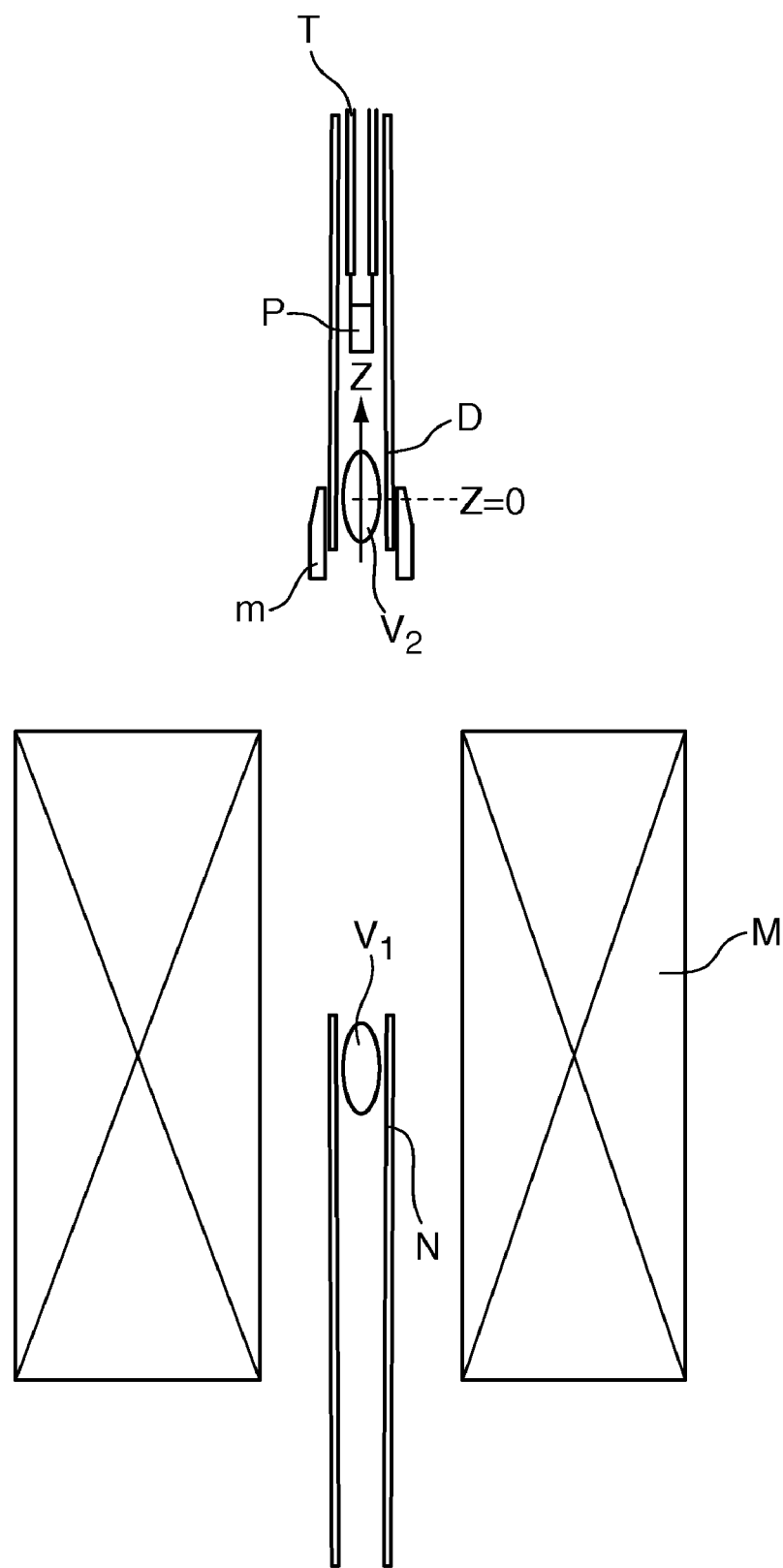
FIG. 1 a first embodiment of an inventive apparatus for DNP-NMR measurement of a sample with a compensation configuration.

FIG. 1 shows an apparatus for DNP-NMR measurement of a sample P. The NMR measurement is performed in the first working volume V1 that is surrounded by a magnet configuration M. The magnet configuration M produces a homogeneous magnetic field (H0 field) in the first working volume V1 and, in the second working volume V2, a stray field in the direction of an axis (z-axis) with a magnetic field gradient H1M and/or with field gradients of higher orders (H2M, H3M, . . . ) in this direction. A device N for NMR measurement (probehead) is disposed around the first working volume V1. The sample P can be moved between the first working volume V1 and the second working volume V2 by means of a transporting mechanism T. Near the second working volume V2, a compensation configuration m made of magnetic material and a device D for DNP excitation is mounted. The compensation configuration m is disposed in a limited axial region around the z-axis. In this case, the compensation configuration m partially surrounds the second working volume. However, the invention also comprises apparatuses in which the compensation configuration is disposed axially outside the second working volume V2, preferably between the first working volume V1 and the second working volume V2. It is also conceivable for the second working volume V2 to be completely surrounded by the compensation configuration m. The working volumes V1, V2 are defined either by the sample P itself or by the device N for NMR measurement or by the device D for DNP excitation, z=0 being the center of the second working volume V2.

FIG. 1 depicts an especially preferred embodiment in which the z-axis coincides both with the direction of the H0 field of the magnet configuration M and with the direction in which the sample P can be transported with the transporting mechanism T. However, other embodiments are also conceivable. In any case, the z-axis is defined by the field vector of the stray field caused by the magnet configuration M at the location of the second working volume V2.

To conduct a DNP-NMR measurement, the sample P is first placed in the second working volume V2 where it is pre-polarized by means of the DNP device D. As quickly as possible thereafter, the sample P is then moved from the second working volume V2 to the first working volume V1 by the transporting mechanism T. There the actual NMR measurement is performed by the NMR device N. To ensure that the sample P is still sufficiently polarized when the NMR experiment is conducted, the working volumes V1, V2 are disposed as close together as possible. The magnetic field gradients H1M, H2M, H3M, ... of the stray field of the magnet configuration M that occur in the second working volume V2 and are unwanted for the DNP pre-polarization at this location are inventively eliminated by the compensation configuration m.

Figure 2:
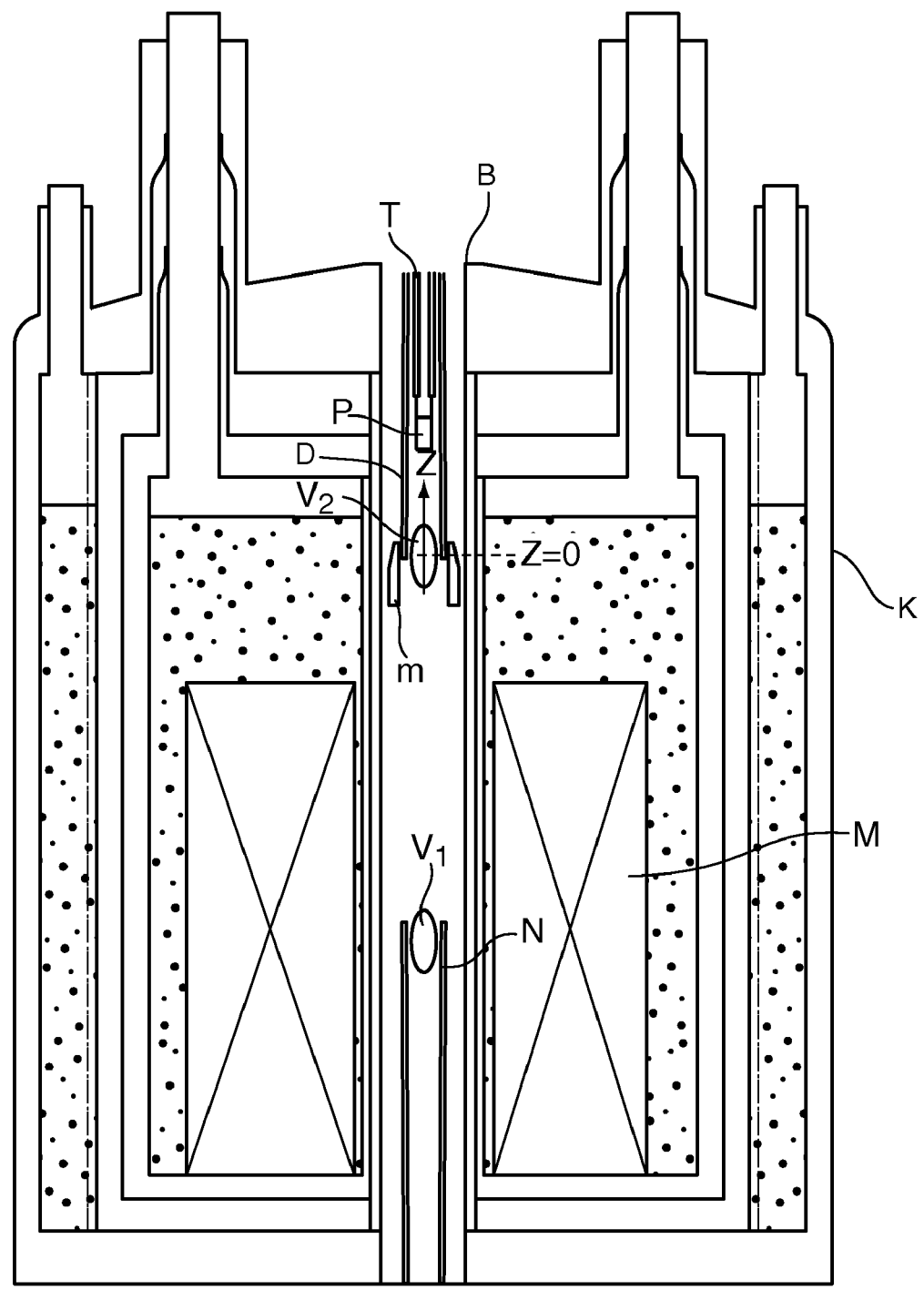
FIG. 2 a further embodiment of the inventive apparatus with a cryostat, wherein the compensation configuration is disposed in the bore of the cryostat.
Figure 3:
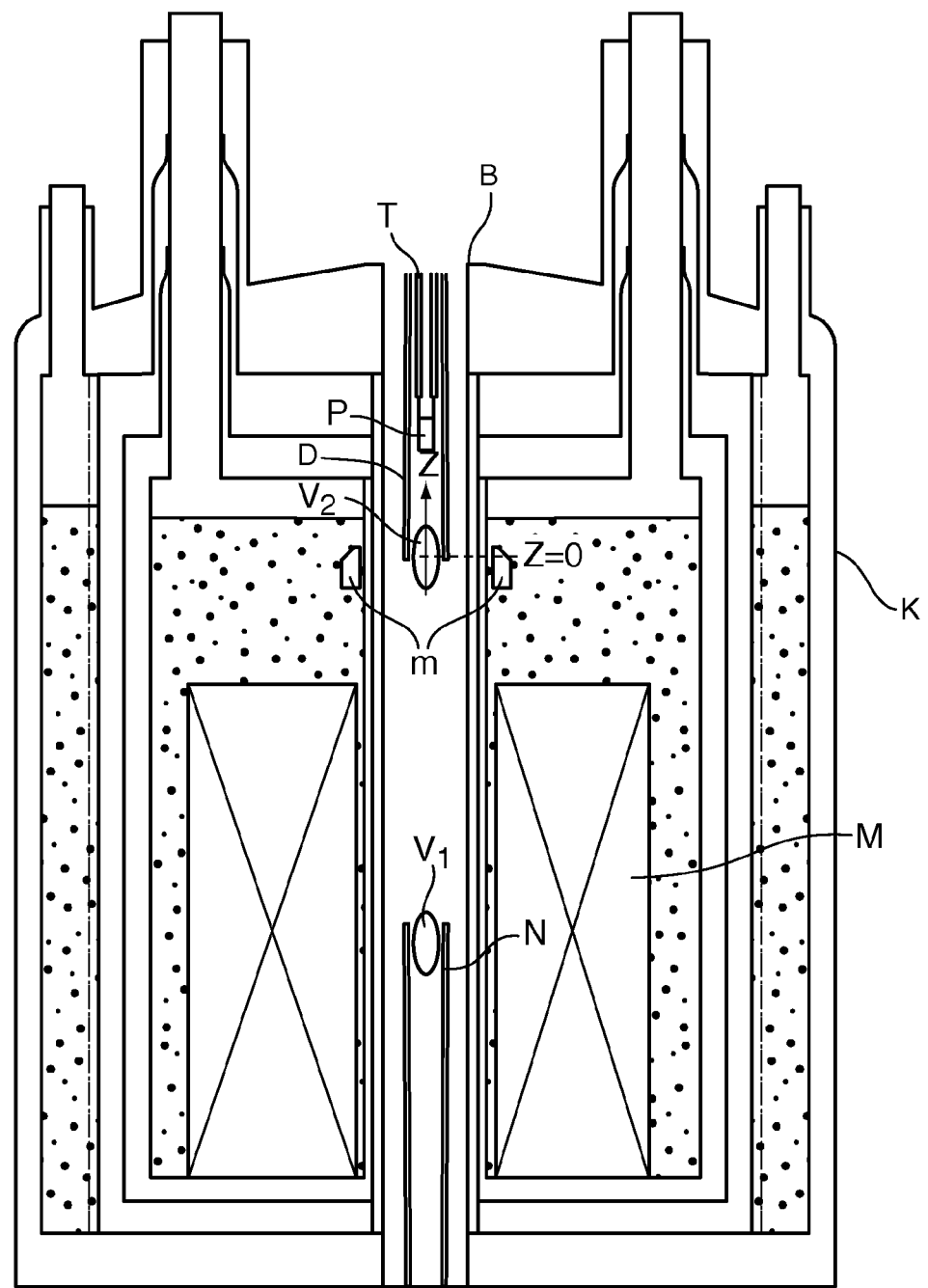
FIG. 3 a further embodiment of the inventive apparatus with a cryostat, wherein the compensation configuration is disposed in the cryostat.

The inventive apparatus can be operated either with a superconducting or with a non-superconducting magnet configuration. If a superconducting magnet configuration M is used, M must be disposed within a cryo vessel K with a bore B (room temperature bore) as shown in FIGS. 2 and 3. In the embodiment of the inventive apparatus shown in FIG. 2, the first working volume V1, the second working volume V2, the device N for NMR measurement, the compensation configuration m, and the device D for DNP excitation are co-axially disposed within the bore B that constitutes a room temperature access for the first and second working volumes V1, V2.

If there is insufficient space within the bore B of the cryostat K, certain parts of the apparatus can also be disposed within the cryostat K, which is normally possible without enlarging the cryostat K. This is shown in FIG. 3 for the compensation configuration.

Figure 4:
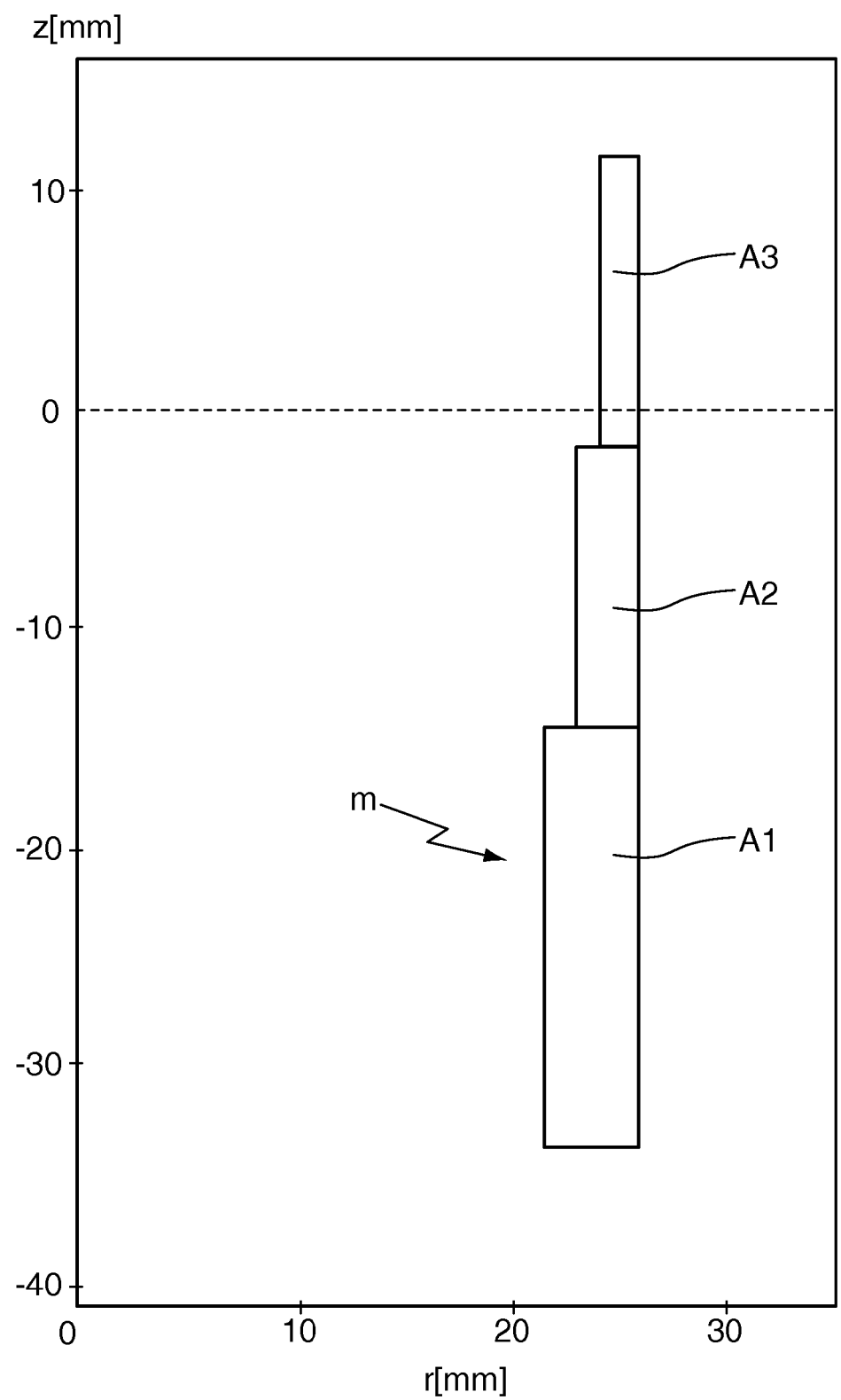
FIG. 4 a sectional view of one radial half of a special embodiment of the inventive compensation configuration with a common outer diameter of all parts of the compensation configuration.
Figure 6:
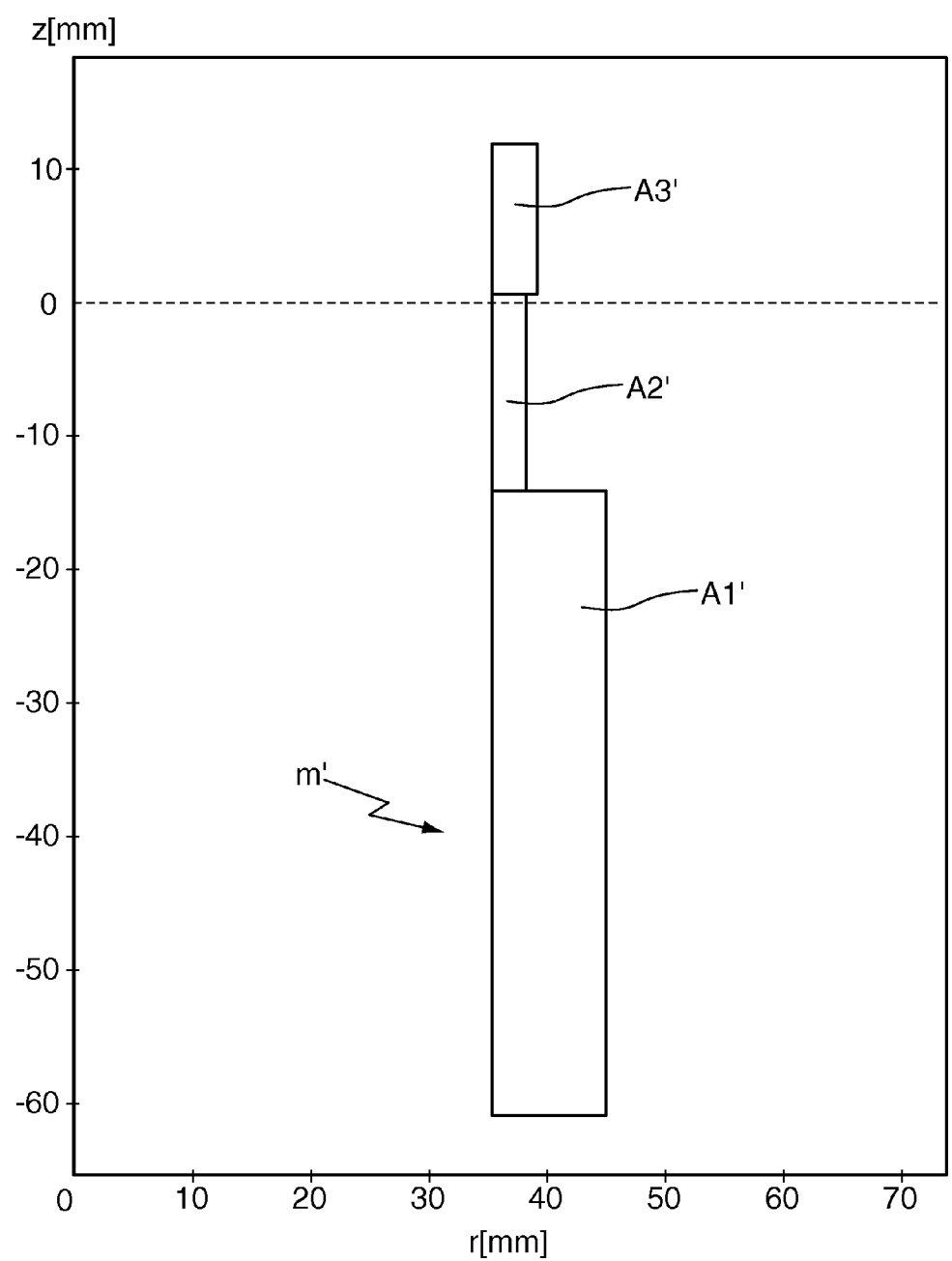
FIG. 6 a sectional view of one radial half of a further special embodiment of the inventive compensation configuration with a common inner diameter of all parts of the compensation configuration FIG. 7 the superposition of the fields of the magnet configuration and the compensation configuration from FIG. 6 on the axis of the second working volume.

FIGS. 4, 6 show detailed views of one radial half of each of two embodiments of the inventive compensation configuration m, m'. The invention will now be explained using the examples of compensation configurations m, m' made of magnetically soft material shown in FIGS. 4, 6:

In the second working volume V2 in which the pre-polarization of the sample P is performed, the magnet configuration M produces a field that can be expanded into a power series along the z-axis:

$$BM(z) = H0M + H1M^*z + H2M^*z^2 + \ldots,$$

where z is the axial distance from the center of the second working volume V2. The expansion coefficients HnM are the nth order gradients of the field of the magnet configuration M on the z-axis in the working volume V2. The magnet configuration M in both examples is an actively shielded 14.1 T magnet whose field exhibits gradients of the following strength on the z-axis in the second working volume V2:

$H0\,M = 0.388\ T$ $H1M = -5\ T/m$ $H2M = 30\ T/m^2$

The centers of gravity of the first working volume V1 and of the second working volume V2 are 450 mm apart in these examples. The gradients of higher orders H3M, H4M, ... can be neglected.

The field in the second working volume V2 is to be homogenized with the compensation configuration m, m' made of magnetically soft material to the extent necessary to enable strong DNP pre-polarization of the sample P therein. This can be achieved, in particular, by compensating gradients H1M and H2M without producing excessive gradients of higher orders with the compensation configuration m, m'. The compensation configurations are rotationally symmetrical with respect to the z-axis and each comprise three sections A1, A1'; A2, A2'; A3, A3' in the form of hollow cylinders. In each case, ri refer to the inner radii and ra to the outer radii of the hollow cylinders, and zi are the axial beginnings and za the axial ends of the hollow cylinders measured from the center of the second working volume V2. Shaping the sections as hollow cylinders is an especially simple way of implementing an inventive compensation configuration. However, it is also possible to provide a compensation configuration that incompletely azimuthally surrounds the z-axis and comprises, for example, individual segments that are spaced from one another.

TABLE 1

Figure 5:
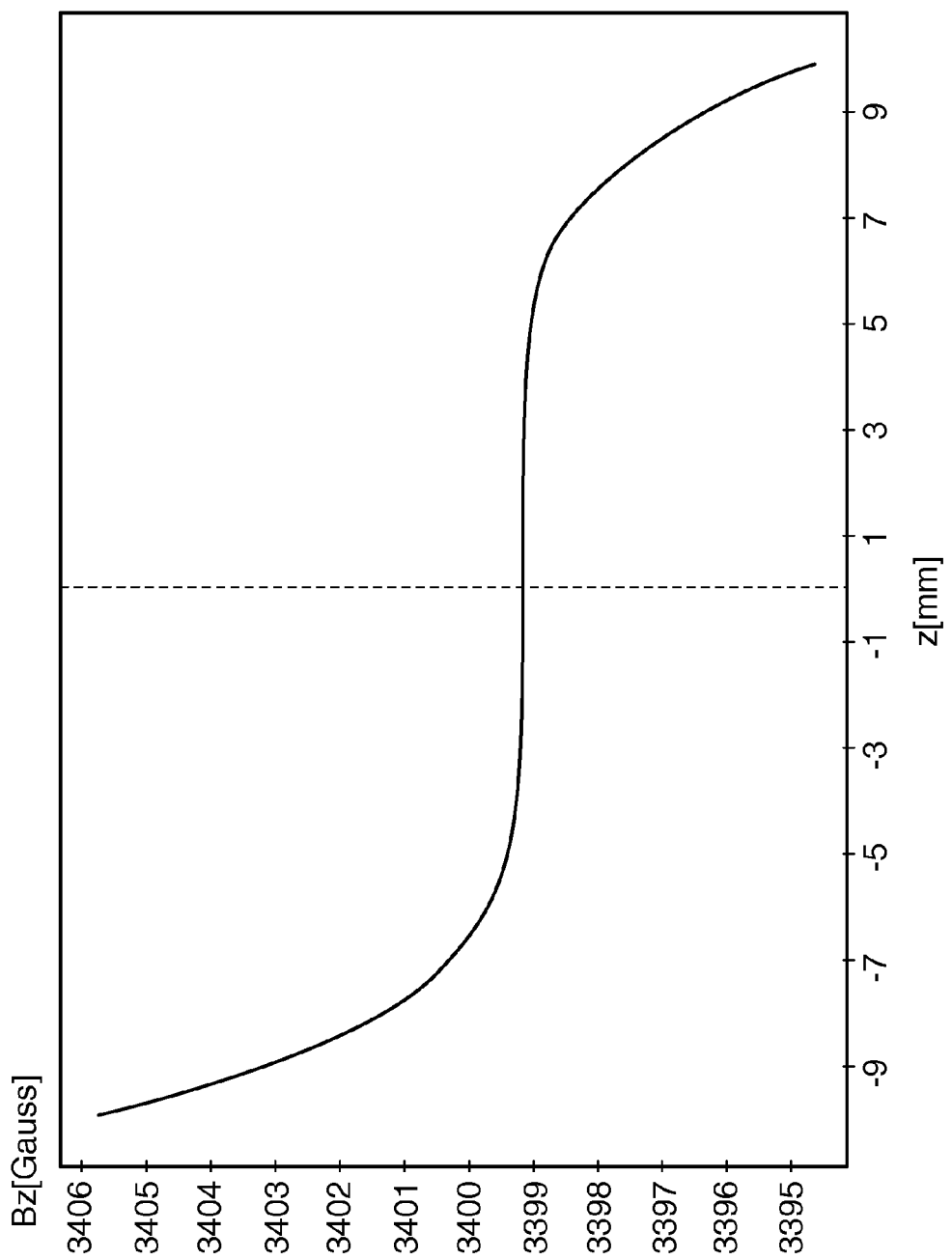
FIG. 5 the superposition of the fields of the magnet configuration and the compensation configuration from FIG. 4 on the axis of the second working volume.
Figure 7:
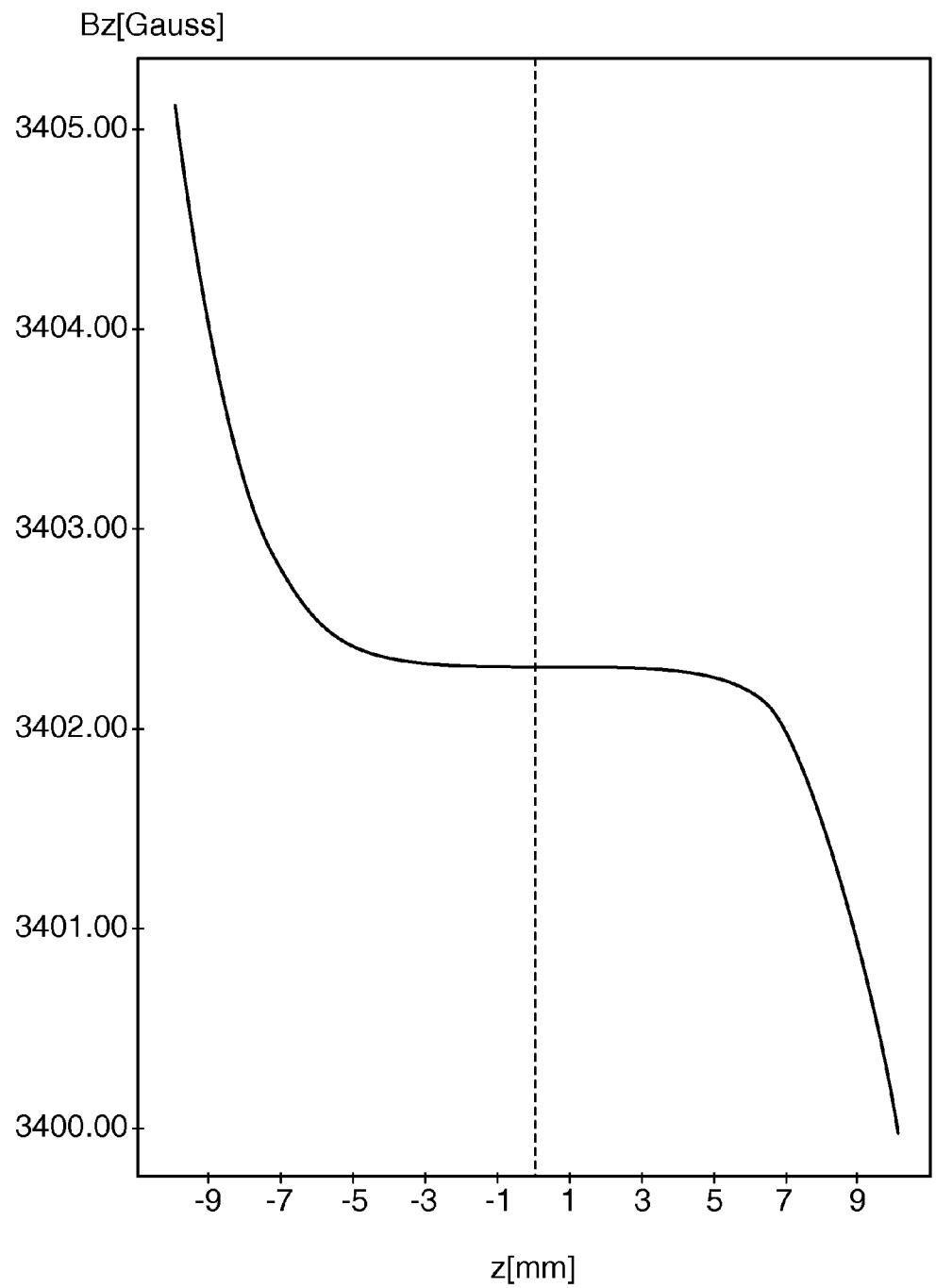

|  | Example 1 | Example2 |
|---|---|---|
| ri [mm] hollow cylinder 1 | 21.50 | 35.00 |
| ra [mm] hollow cylinder 1 | 26.00 | 45.05 |
| zi [mm] hollow cylinder 1 | −33.72 | −60.94 |
| za [mm] hollow cylinder 1 | −14.49 | −14.18 |
| ri [mm] hollow cylinder 2 | 23.12 | 35.00 |
| ra [mm] hollow cylinder 2 | 26.00 | 38.08 |
| zi [mm] hollow cylinder 2 | −14.49 | −14.18 |
| za [mm] hollow cylinder 2 | −1.75 | 0.62 |
| ri [mm] hollow cylinder 3 | 24.20 | 35.00 |
| ra [mm] hollow cylinder 3 | 26.00 | 39.07 |
| zi [mm] hollow cylinder 3 | −1.75 | 0.62 |
| za [mm] hollow cylinder 3 | 11.48 | 11.93 |
| Mapping geometry | FIG. 4 | FIG. 6 |
| Field profile in the second working volume | FIG. 5 | FIG. 7 |
| z center of gravity [mm] | −15.18 | −31.88 |
| H0m [Tesla] | −0.0481 | −0.0478 |

In example 1 (FIG. 4), all hollow cylinders have a common outer radius ra. That is advantageous because, after a field measurement, correction foils can be mounted on the outer surface with a uniform outer radius to improve the field homogeneity in the second working volume V2 still further. Such a compensation configuration m could, for example, be located in the room temperature bore B of a cryostat K with superconducting magnet configuration M, as shown in FIG. 2. The wall thickness of the compensation configuration m in example 1 becomes smaller as the z-value increases, that is, further away from the magnet configuration M and from the first working volume V1. This homogenizes the field in the second working volume V2 because the magnetically soft material nearer the magnet configuration M shields more field, that is, has thicker walls than at a greater distance from the magnet configuration M, where its stray field is weaker.

Example 2 (FIG. 6) shows that this rule for the dependence of the wall thickness of the compensation configuration m' on the position on the z-axis does not have to be strictly complied with, but that compensation is also possible if the wall thickness increases again in a small area with increasing distance from the first working volume V1.

Finally, FIGS. 5 and 7 show the magnetic field profiles that result from superposition of the field of the magnet configuration M and the relevant compensation configuration m, m'. It can be seen that the magnetic field increases monotonically towards the first working volume V1, that is, with negative z-values,. In both examples that is the case not only locally in the second working volume V2, but also along the z-axis into the first working volume V1 because, closer to the first working volume V1, the monotonically increasing field of the magnet configuration M more and more dominates the field of the compensation configuration m, m'. In this way, the sample P is transported between the second working volume V2 and the first working volume V1 through fields with increasing strength, thus favoring maintenance of its pre-polarization obtained in the second working volume V2. At this point, it must be noted that correction configurations m made of magnetically soft material usually shield some of the field so that H0m is negative in both examples.

In example 2 (FIG. 6), all hollow cylinders have a common inner radius. The advantage of such an embodiment is that the compensation configuration m' can be located in the same vessel as a superconducting magnet configuration M. With the constant inner radius chosen to be as small as possible, maximum field efficiency of the compensation configuration m' is also ensured for this type of configuration.

In the design of the compensation configurations m, m' of the two examples, it was assumed that the compensation configuration m, m' consists of magnetically soft material that is driven into magnetic saturation by the stray field of the magnet configuration M, which is a permissible assumption in the case of the assumed field profile of the magnet configuration M with gradients H0M=0.388 T, H1M=−5 T/m, and H2M=30 T/m$^2$. The magnetization of the compensation configuration m, m' was also assumed to be parallel to the z-axis, which essentially corresponds to the direction of the stray field of the magnet configuration M in the volume of the compensation configuration m, m'. For the magnetic saturation of the magnetically soft material, a magnetization $M_m$ of 1.71*10$^6$ A/m typical of magnetic steel was assumed.

The magnetic field of a purely axially magnetized hollow cylinder in saturation with magnetization $M_m$ is equivalent to the difference of the magnetic fields of two current sheets with current density $M_m$ in consequence of the field equation $$j = \text{curl } M_m$$

where these current sheets are located on the inner and outer surfaces of the hollow cylinder. The magnetic field of an infinitely thin cylindrical current sheet with radius a and length 2L that is centered around z=0 and is coaxial with respect to the z-axis is calculated on the z-axis using the Biot-Savart formula as follows:

$$B_z(z) = \frac{\mu_0 M_m}{2}\left(\frac{z+L}{\sqrt{a^2+(z+L)^2}} - \frac{z-L}{\sqrt{a^2+(z-L)^2}}\right)$$

The field of a hollow cylinder of length 2L that is centered around z=0 and is coaxial with respect to the z-axis with inner radius ri and outer radius ra is therefore $$B_{z,Zyl}(z) = \frac{\mu_0 M_m}{2}\left(\frac{z+L}{\sqrt{ra^2+(z+L)^2}} - \frac{z-L}{\sqrt{ra^2+(z-L)^2}}\right) - \frac{\mu_0 M_m}{2}\left(\frac{z+L}{\sqrt{ri^2+(z+L)^2}} - \frac{z-L}{\sqrt{ri^2+(z-L)^2}}\right)$$

The field of a hollow cylinder of length 2L centered around the location z=−z0 and coaxial with respect to the z-axis with inner radius ri and outer radius ra can therefore be expanded into a power series $$Bm(z) = H0m + H1m^*z + H2m^*z^2 + $$

around the center of the second working volume V2, located at z=0, wherein the expansion coefficients (gradients) Hnm of the nth order are the nth derivatives of $B_{z,Zyl}(z)$ with respect to z at location z=z0.

If a compensation configuration m, m' comprises multiple coaxial hollow cylinders, the gradient of the nth order of the total configuration is always the sum of the gradients of the nth order of all partial cylinders.

Using the power series expansions of the compensation configuration m, m' and that of the field of the magnet configuration M, the total field on the z-axis in the second working volume can, for both examples, be written as:

$$B(z) = BM(z) + Bm(z) = (H0M+H0m) + (H1M+H1m)^*z + (H2M+H2m)^*z^2 + \ldots$$

To achieve field homogeneity that is sufficient for the DNP pre-polarization of the sample P in the second working volume V2, the compensation configuration m, m' in both examples was dimensioned such that H1m=−H1M and H2m=−H2M. The superposition of the field of the magnet configuration M and the field of the compensation configuration m, m' therefore does not have a term in z and in z$^2$. The compensation configuration m, m' was also dimensioned such that the coefficients H3m and H4m are sufficiently small that they do not have any influence on the field profile in the second working volume V2, which can also be assumed for the field contribution of the magnet configuration M. The dominant term for the field profile in the second working volume V2 is therefore H5m$^*z^5$ in both examples so that a z$^5$ plateau results in which the pre-polarization of the sample P can occur.

Because the field of the magnet configuration M is inhomogeneous at the location of the compensation configuration m, m', an attractive electromagnetic force is exerted between the two configurations that must be considered when designing the compensation configuration m, m'. With the approximation of the power series expansion for the field of the magnet configuration M in the volume of the compensation configuration m, this force can be calculated as 230 and 1650 newtons respectively for the two examples. The compensation configuration m from example 1 can therefore, for example, be removed without great effort from the bore B of a cryostat K of a superconducting magnet configuration M without having to discharge the magnet configuration M.

In this way, magnetically soft correction foils can be mounted without any great waste of time.

Compensation configurations m, m' can be provided for actively shielded and for unshielded magnet configurations. They are easier to design for unshielded magnet configurations than in conjunction with an actively shielded magnet configuration because the field decrease between the first working volume V1 and the second working volume V2 is less steep, meaning that, for the same field H0M, the absolute value of the field gradient H1M of an unshielded magnet configuration in the second working volume V2 is smaller than in the case of an actively shielded magnet configuration. The disadvantage of unshielded magnet configurations, however, is that the distance between the first working volume V1 and the second working volume V2 is greater so that the sample P requires more time for transportation. During this time, part of the polarization of the sample P may be lost.

The compensation configuration m, m' can comprise magnetically hard parts in addition to the magnetically soft parts. Moreover, the compensation configuration m, m' can comprise parts that are not axially symmetrical or parts that are not in magnetic saturation or not purely axially magnetized. To calculate the field gradients Hnm of such configurations, the precise geometric configuration of the components and the strength and direction of their magnetization must be considered. Generally, this is only possible if the B-H curves of the relevant materials are known and if numerical methods are used such as the finite element method.

Because manufacturing tolerances are unavoidable and because the material properties of the compensation configuration m, m' are not precisely known, it must be expected that the superposition of the field profiles of the magnet configuration M and the compensation configuration m, m' in the second working volume V2 do not exhibit precisely the desired homogeneity. The homogeneity can be further improved by mounting magnetically soft foils on the compensation configuration m, m'.

Moreover, a further coil configuration can be mounted around the second working volume V2 and designed such that gradients of any desired order can be corrected. Typical geometries of such coil configurations are known, for example, from the patent specification U.S. Pat. No. 7,330,031.

An additional possibility for improving the field homogeneity in the second working volume V2 is a device with which the compensation configuration m, m' can be moved together with the second working volume V2 along the z-axis in the stray field of the magnet configuration M until $|HnM+Hnm|<0.1*|HnM|$ applies at least for one order n of the gradients of the magnet configuration M and the compensation configuration m, m'. If, in the inventive configuration of the two examples, the measured field profile of the superposition of the field contributions of the compensation configuration m, m' and the magnet configuration M has a gradient of first order that is too small, for example, by 0.1 T/m, the compensation configuration m, m' can be moved together with the working volume along the z-axis to location z' at which the gradient of first order of the magnet configuration M is 0.1 T/m greater, that is:

$$\left.\frac{dBM}{dz}\right|_{z'} = H1M + 2 \cdot H2M \cdot z' = H1M + 0.1 T/m$$

Therefore, if H2M=30 T/m$^2$, z'=1.7 mm.

LIST OF REFERENCES

A1, A2, A3 Sections of the compensation configuration
A1', A2', A3'
B Room temperature bore of the cryostat
D Device for DNP excitation
H1M, H2M, H3M, . . . Magnetic field gradients of the stray field produced by the magnet configuration in the second working volume
H1m, H2m, H3m, . . . Magnetic field gradients of the compensation field produced by the compensation configuration in the second working volume
K Cryostat
M Magnet configuration
m, m' Compensation configuration
N Device for measurement of MR signals
P Sample
T Transporting mechanism
V1 First working volume
V2 Second working volume
z Axis extending through the first and the second working volume

We claim:

1. An apparatus for carrying out DNP-NMR measurements on a sample, the apparatus comprising:
   a magnet configuration for producing a magnetic field in a first working volume, said magnet configuration also producing a stray field in a second working volume in a direction of an axis with at least one first magnetic field gradient of first or higher order in said direction of said axis, wherein said axis extends through said second working volume;
   a device for measuring MR signals of the sample from said first working volume;
   a DNP excitation device for DNP excitation of the sample in said second working volume;
   a positioning mechanism for transferring the sample between said second working volume and said first working volume; and
   a compensation configuration made of magnetic material and disposed near said second working volume, wherein, in an operating condition of said magnet configuration, said compensation configuration produces at least one second magnetic field gradient of first order or higher order in said direction of said axis in said second working volume that is between −90% and −110% of said first magnetic field gradient of a same order of said stray field of said magnet configuration in said direction of said axis in said second working volume.

2. The apparatus of claim 1, wherein said compensation configuration comprises magnetically soft sections that, in said operating condition of said magnet configuration, are magnetized by said magnetic field of said magnet configuration.

3. The apparatus of claim 2, wherein a saturation magnetization of said magnetically soft sections is at least $10^6$ A/m.

4. The apparatus of claim 2, wherein a distance between a center of gravity of said first working volume and a center of gravity of said second working volume is greater than a distance between said center of gravity of said first working volume and a center of gravity of a totality of said magnetically soft sections.

5. The apparatus of claim 2, wherein a center of gravity of said first working volume and a center of gravity of said second working volume are on said axis.

6. The apparatus of claim 5, wherein said compensation configuration is rotationally symmetrical with respect to said axis.

7. The apparatus of claim 6, wherein said magnetically soft sections exhibit a common inner or outer diameter, wherein a wall thickness of said sections decreases or remains constant in said direction of said axis with increasing distance from said first working volume.

8. The apparatus of claim 1, wherein said magnet configuration is at least partially superconducting and is disposed at least partially in a cryostat that has a bore in which said first working volume and said second working volume are disposed.

9. The apparatus of claim 8, wherein said compensation configuration is disposed at least partially in said bore of said cryostat.

10. The apparatus of claim 8, wherein said compensation configuration is disposed outside said bore of said cryostat in a region of said cryostat having a temperature below room temperature or in a region of said cryostat having the operating temperature of superconducting parts of said magnet configuration.

11. The apparatus of claim 8, wherein an axis of said bore of said cryostat passes through said second working volume.

12. The apparatus of claim 1, wherein a distance between a center of gravity of said first working volume and a center of gravity of said second working volume is less than 1 meter.

13. The apparatus of claim 1, wherein, in said operating condition of said magnet configuration, an absolute value of a magnetic field strength on a path between a center of gravity of said first working volume and a center of gravity of said second working volume is, at all positions, at least half an absolute value of a magnetic field strength in said second working volume.

14. The apparatus of claim 1, wherein said magnet configuration comprises a coil configuration that at least partially compensates for a dipole moment of said magnet configuration.

15. The apparatus of claim 1, further comprising a further coil configuration that can be supplied with electric current to produce, in said second working volume, a homogeneous magnetic field contribution and/or a magnetic field gradient of first or higher order in said direction of said axis.

16. The apparatus of claim 15, wherein said further coil configuration is normally conducting.

17. The apparatus of claim 16, wherein said further coil configuration is disposed at least partially in a bore of a cryostat in which said first working volume and said second working volume are disposed.

18. The apparatus of claim 15, wherein said further coil configuration is superconducting.

19. The apparatus of claim 1, further comprising a device for moving said compensation configuration or sections of said compensation configuration and for moving said second working volume along said axis.

20. A method for designing a compensation configuration of magnetic material, the method comprising the steps of:
  a) producing a magnetic field in a first working volume using a magnet configuration, said magnet configuration also producing a stray field in a second working volume in a direction of an axis with at least one first magnetic field gradient of first or higher order in said direction of said axis, wherein said axis extends through said second working volume;
  b) producing, in an operating condition of said magnet configuration and using a compensation configuration made of magnetic material which is disposed near said second working volume, at least one second magnetic field gradient of first order or higher order in said direction of said axis in said second working volume;

performing at least one measurement in said second working volume in said direction of said axis of a magnetic field profile that results from superposition of a field contribution of said compensation configuration with a field contribution of said magnet configuration;

changing, in dependence on results of step c), said compensation configuration at least once to ensure that, in the superposition of the field contribution of the compensation configuration with the field contribution of the magnet configuration, an absolute value of at least one magnetic field gradient of first or higher order in said direction of said axis is reduced in said second working volume, thereby producing at least one second magnetic field gradient of first order or higher order in said direction of said axis in said second working volume that is between −90% and −110% of said first magnetic field gradient of a same order of said stray field of said magnet configuration in said direction of said axis in said second working volume;

e) generating DNP excitation of the sample in said second working volume;

f) transferring the sample, using a positioning mechanism, between said second working volume and said first working volume; and g) measuring MR signals of the sample from said first working volume.

21. The method of claim 20, wherein step d) comprises mounting or removal of magnetic material or mounting of magnetic foils.

22. A method for designing a compensation configuration of magnetic material, the method comprising the steps of:
  a) producing a magnetic field in a first working volume using a magnet configuration, said magnet configuration also producing a stray field in a second working volume in a direction of an axis with at least one first magnetic field gradient of first or higher order in said direction of said axis, wherein said axis extends through said second working volume;
  b) producing, in an operating condition of said magnet configuration and using a compensation configuration made of magnetic material which is disposed near said second working volume, at least one second magnetic field gradient of first order or higher order in said direction of said axis in said second working volume;

performing at least one measurement in said second working volume in said direction of said axis of a magnetic field profile that results from superposition of a field contribution of said compensation configuration with a field contribution of said magnet configuration;

moving, in dependence on results of step c), said compensation configuration, or portions of said compensation configuration, together with said second working volume along said axis to ensure that, in the superposition of the field contribution of the compensation configuration with the field contribution of the magnet configuration, an absolute value of at least one magnetic field gradient of first or higher order in said direction of said axis is reduced in said second working volume, thereby producing at least one second magnetic field gradient of first order or higher order in said direction of said axis in said second working volume that is between −90% and −110% of said first magnetic field gradient of a same order of said stray field of said magnet configuration in said direction of said axis in said second working volume;

e) generating DNP excitation of the sample in said second working volume;

f) transferring the sample, using a positioning mechanism, between said second working volume and said first working volume; and g) measuring MR signals of the sample from said first working volume.

* * * * *